United States Patent [19]

Haque et al.

[11] 4,438,354

[45] Mar. 20, 1984

[54] MONOLITHIC PROGRAMMABLE GAIN-INTEGRATOR STAGE

[75] Inventors: Yusuf A. Haque, San Jose; Vikram Saletore, Cupertino; Jeffrey A. Schuler, Saratoga, all of Calif.

[73] Assignee: American Microsystems, Incorporated, Santa Clara, Calif.

[21] Appl. No.: 292,870

[22] Filed: Aug. 14, 1981

[51] Int. Cl.³ .................. H03G 3/00; H03K 5/00; G06G 7/18

[52] U.S. Cl. .................... 307/493; 307/491; 330/9; 328/127

[58] Field of Search ............ 328/127; 307/493, 491; 330/9, 284, 144

[56] References Cited

U.S. PATENT DOCUMENTS 4,163,947 8/1979 Weedon .............................. 328/127
4,328,465 5/1982 Takaoka et al. .................... 330/284
4,365,204 12/1982 Haque ................................. 328/127

OTHER PUBLICATIONS

Hosticka et al., "MOS Sampled Data Recursive Filters Using Switched Capacitor Integrators", IEEE Journal of Solid-State Circuits, vol. SC-12, No. 6, Dec. 1977, pp. 600-607.

Primary Examiner—John S. Heyman
Assistant Examiner—Timothy P. Callahan
Attorney, Agent, or Firm—Alan H. MacPherson; Steven F. Caserza; Richard Franklin

[57] ABSTRACT

A switched capacitor gain stage (110, 120) having a programmable gain factor. This gain factor is determined by the connection of desired gain determining components (14-17; 25-28) contained within a component array (100, 101). A sample and hold circuit (46) is provided for the storage of the error voltage of the entire gain-integrator stage. This stored error voltage ($V_{error}$) is inverted and integrated one time for each integration of the input voltage ($V_{in}$), thus eliminating the effects of the inherent offset voltages of the circuit from the output voltage ($V_{out}$).

10 Claims, 2 Drawing Figures

MONOLITHIC PROGRAMMABLE GAIN-INTEGRATOR STAGE

BACKGROUND OF THE INVENTION

1. Field of the Invention

This invention relates to operational amplifiers and more specifically to a gain-integrator stage utilizing operational amplifiers wherein the effects of the inherent offset voltages of the operational amplifiers contained within the circuit are eliminated. Offset voltages from other causes, including parasitic capacitances, switch operation, and leakage currents, are also eliminated.

2. Description of the Prior Art

The use of operational amplifiers to form gain-integrator stages is well-known. A schematic diagram of one such prior art circuit is shown in FIG. 1. Operational amplifier 115 receives input voltage $V_{in}$ from input terminal 111 through a switched capacitor means comprised of switches 112 and 113, and capacitor 114. The use of switched capacitors in this manner is well-known in the prior art. See, for example, an article entitled "Analog Sample Data Filters", IEEE Journal of Solid-Stage Circuits, August 1972, Pg. 302. The closed loop gain ($G_1$) of operational amplifier 115 is equal to the negative of the ratio of the capacitance of capacitor 114 to the capacitance of capacitor 116, as is well-known. In a similar manner the closed loop gain ($G_2$) of operational amplifier 120 is equal to the negative of the ratio of the capacitance of capacitor 119 to the capacitance of capacitor 121. The overall gain of the circuit of FIG. 1 is equal to the product $G_1G_2$.

The use of capacitors to determine the closed loop gain of an operational amplifier is particularly useful when metal oxide semiconductor (MOS) devices are used as the active elements in the operational amplifier because resistance values, and thus the closed loop gain of an operational amplifier utilizing MOS resistors as the gain determining components, are not highly controllable. In contrast, capacitance values are determined by the plate size and the dielectric thickness. Capacitor plate sizes are highly controllable in MOS devices, and dielectric thickness is quite uniform across an MOS device. Thus, capacitance ratios, and therefore the closed loop gain of an operational amplifier using capacitors as shown in FIG. 1, are quite controllable in MOS devices.

As is well-known, component mismatches during the fabrication of operational amplifiers using integrated circuit technology result in an inherent offset voltage $V_{off}$ unique to each operational amplifier. This offset voltage is defined as the voltage $V_{out}$ appearing on the output lead of the operational amplifier when the amplifier is in the unity gain mode (inverting input lead and output lead connected) and its noninverting input lead grounded. Thus, the actual output voltage $V_{out}$ of operational amplifier 115 available at node 150 is given in Equation (1):

$$V_{out1}=G_1V_{in}+V_{off1} \qquad (1)$$

Similarly, the output voltage of operational amplifier 120, available at node 151, is given by Equation (2):

$$V_{out}=G_2V_{out1}+V_{off2} \qquad (2)$$

Thus, the output voltage at node 151, expressed as a function of the input voltage $V_{in}$, is shown in Equation (3):

$$V_{out}=G_1G_2V_{in}+G_2V_{off1}+V_{off2} \qquad (3)$$

Thus, the error component of the output voltage available at nod 151 is:

$$V_{error}=G_2V_{off1}+V_{off2} \qquad (4)$$

where
- $V_{out1}$ = the output voltage of operational amplifier 115 available at node 150;
- $V_{out}$ = the output voltage of operational amplifier 120 available at node 151;
- $G_1$ = the closed loop gain of operational amplifier 115;
- $G_2$ = the closed loop gain of operational amplifier 120;
- $V_{off1}$ = the inherent offset voltage of operational amplifier 115;
- $V_{off2}$ = the inherent offset voltage of operational amplifier 120; and
- $V_{error}$ = the error component of $V_{out}$.

The presence of inherent offset voltage $V_{off1}$ and $V_{off2}$ reduces the dynamic range of the gain-integrator stage of FIG. 1 because the output voltages of operational amplifiers 115 and 120 will saturate at a lower input voltage differential than ideal operational amplifiers free from inherent offset voltages. One prior art method of minimizing the effect of the error component, $V_{error}$, is the use of DC blocking capacitor 122 between node 151 and output terminal 123. DC blocking capacitor 122 blocks the DC error component $V_{error}$. However, the use of DC blocking capacitor 122 is undesirable because it must be rather large, on the order of approximately 0.1 microfarad, thus resulting in increased cost and the need for an off-chip component if the gain integrator stage is to be formed as an integrated circuit. Furthermoe, DC blocking capacitor 122 effectively blocks all DC components of the output voltage, not just the DC components attributable to offset voltages. Thus, desired DC components of the output voltage are also blocked by DC blocking capacitor 122.

SUMMARY

In accordance with this invention, a unique gain-integrator circuit is provided wherein the closed loop gain of each operational amplifier stage contained therein is programmable by the connection of selected capacitors contained in a capacitor array comprising a plurality of capacitors, thus allowing a wide range of possible gains. The circuit of this invention also utilizes a unique integrating circuit wherein the amplified input voltages containing offset voltages are alternately integrated with the inverse of the offset voltages, thus providing an integrated output voltage free from the effects of the inherent offset voltages of the operational amplifiers utilized in the circuit, as well as the offset voltages due to parasitic capacitances, leakage currents, and other causes.

DETAILED DESCRIPTION

Figure 1:
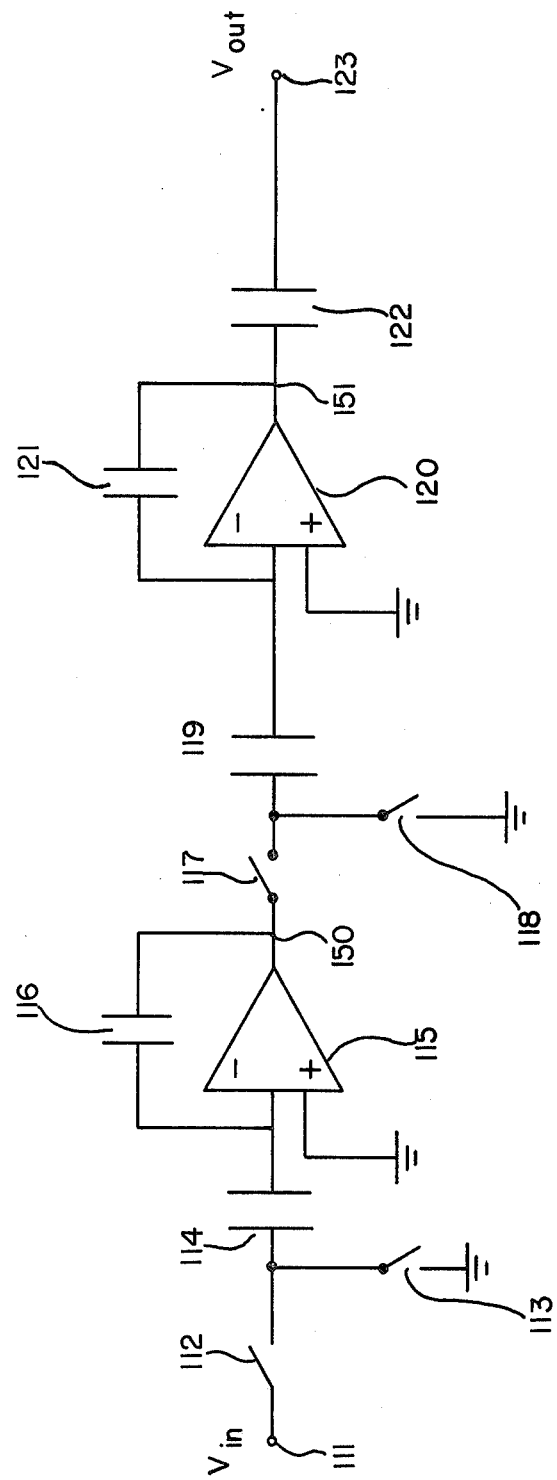
FIG. 1 is an example of a prior art gain stage utilizing a DC blocking capacitor to minimize the effects of the inherent offset voltage of the operational amplifiers.
Figure 2:
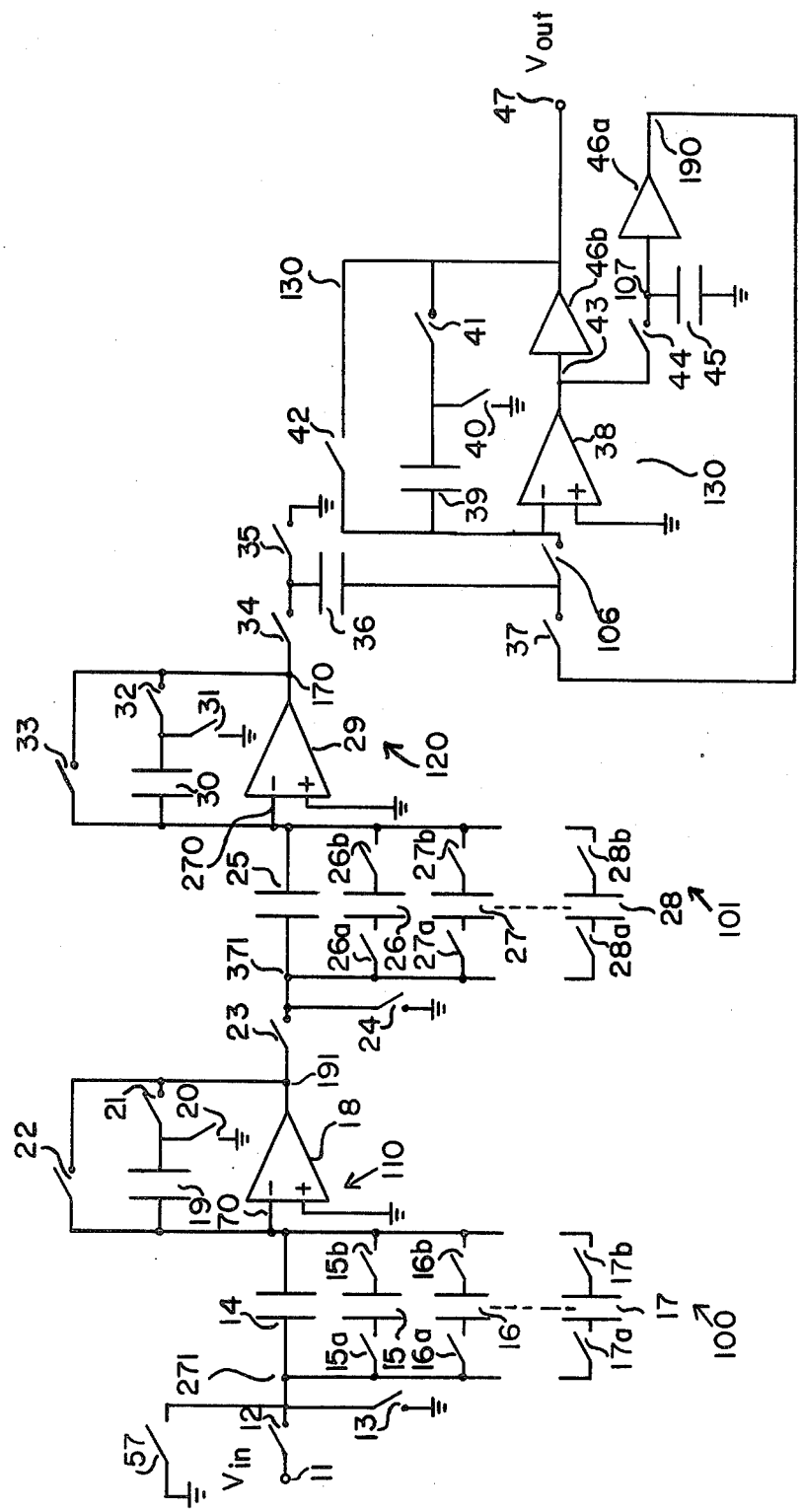
FIG. 2 is a schematic diagram of one embodiment of this invention.

FIG. 2 shows a schematic diagram of this invention. A detailed description of the operation of gain stages 110 and 120 (also called "sample and hold stages") and integrator stage 130 to minimize the effect of the inherent offset voltage of the operational amplifier of each stage is given in co-pending U.S. Pat. No. 4,404,525 filed Mar. 3, 1981 and assigned to American Microsystems, Inc., the assignee of this invention, and thus will not be repeated here. The contents of aforesaid co-pending United States Patent are hereby incorporated by reference.

The closed loop gain of gain stage 110 is equal to the ratio of the capacitance of the selected capacitors of capacitor array 100 to the capacitance of capacitor 19. Selected capacitors of capacitor array 100 are connected between input node 271 and inverting input lead 70 of operational amplifier 18. The use of capacitor array 100, comprised of any desired number of capacitors, allows the gain of sample and hold circuit 110 to be selected from a plurality of possible gains. The capacitors of capacitor array 100 may be of equal capacitance value or may be binary weighted, wherein the Kth of N capacitors has a capacitance equal to $2^{K-1}C$, where N is a selected integer and $1 \leq K \leq N$. Any other desired weighting scheme of capacitor array 100 may be utilized as well.

The operation of sample and hold stage 120 is identical to the operation of sample and hold circuit 110, thus providing an output voltage $V'_{out}$ at node 170 after one sample of the input voltage has been taken:

$$V'_{out} = G_1 G_2 V_{in1} + G_2 V_{off1} + V_{off2}$$

where
 $G_1$ = the closed loop gain of sample and hold circuit 110;
 $G_2$ = the closed loop gain of sample and hold circuit 120;
 $V_{in1}$ = the first sample of the input voltage applied to terminal 11;
 $V_{off1}$ = the offset voltage of sample and hold circuit 110; and
 $V_{off2}$ = the offset voltage of sample and hold circuit 120.

When $V_{in1}$ is equal to zero, the output voltage available at 170 is simply $$V'_{out} = G_2 V_{off1} + V_{off2}.$$

Upon the initialization of the gain integrator circuit of FIG. 2, gain stages 110 and 120 and integrator stage 130 are placed in the unity gain mode to eliminate, or at least minimize, their inherent offset voltages, as described in the previously mentioned co-pending patent. At the same time, any remaining offset voltage (1/A) $V_{off3}$ of operational amplifier 38 (where $V_{off3}$ is the offset voltage of integrator stage 130, and A is the gain of buffers 46a and 46b) appearing on node 107 is stored in capacitor 45 via closed switch 44. Switch 44 then opens, thus providing $V_{off3}$ on output lead 190 of voltage buffer 46a. Of importance, buffer amplifiers 46a and 46b are closely matched, thus providing output voltages substantially equal to $V_{off3}$ when integrator stage 130 is placed in the unity gain mode. The use of voltage buffers 46a and 46b to form a sample and hold circuit for storing the offset voltage of operational amplifier 38 is described in U.S. Pat. No. 4,365,204 issued Dec. 21, 1982 and assigned to American Microsystems, Inc., the assignee of this invention. U.S. Pat. No. 4,365,204 is hereby incorporated by reference.

The operation of the circuit of FIG. 2 is as follows, and may be more clearly understood with reference to Table I.

At time $T_0$, integrator stage 130 is initialized by discharging integration capacitor 39 in the following manner. Switches 34, 35, 37, and 106 are opened, thus leaving capacitor 36 disconnected. Integrator stage 130 is initialized by closing switch 42, thus placing operational amplifier 38, together with buffer amplifier 46b, in the unity gain mode. Thus, $V_{off3}$ is present on output node 47 and the inverting input lead of operational amplifier 38. Switch 41 is opened, and switch 40 closed, thus storing $V_{off3}$ on capacitor 39 connected between the inverting input lead of operational amplifier 38 and ground. Switch 44 is closed, thus storing (1/A) $V_{off3}$ on capacitor 45 (where A is the gain of buffers 46a and 46b), thus making $V_{off3}$ available on output lead 190 of buffer amplifier 46a.

At time $T_1$, gain stages 110 and 120 are initialized in the same manner as described above with respect to the initialization of integrator stage 130, by opening switches 21 and 22 and closing switches 20, 31, 22 and 33. Switch 12 opens and switch 13 closes, and switches 15a, 15b, 16a, 16b . . . , 17a, 17b close, thus initializing capacitor array 100 by discharging each capacitor contained within capacitor array 100. Likewise, switch 23 opens and switch 24 closes, and switches 26a, 26b, 27a, 27b . . . , 28a, 28b close, thus initializing capacitor array 101 by discharging each capacitor contained within capacitor array 101. Dummy switch 57, which serves to minimize the offset voltage due to the operation of switch 13 (more fully explained below) opens.

At time $T_2$, switches 40 and 42 are opened and switch 41 is closed, thus taking integrator stage 130 out of the unity gain mode, and placing integrator stage 130 in the integrating mode. Switch 44 opens, and (1/A) $V_{off3}$ remains stored on capacitor 45, and $V_{off3}$ is available on output lead 190 of buffer amplifier 46a. $V_{off3}$ is also available on the inverting input lead of operational amplifier 38 because the noninverting input lead of operational amplifier 38 is grounded.

At time $T_3$, the gain factor $G_1$ of gain stage 110 is selected by the appropriate connection of selected capacitors within capacitor array 100 between input node 271 and inverting input lead 70 of operational amplifier 18. The gain factor $G_2$ of gain stage 120 is selected by the appropriate connection of capacitors of capacitor array 101 between node 371 and the inverting input lead 270 of operational amplifier 29. As previously mentioned, the gain $G_1$ of gain stage 110 is equal to the negative of the ration of the capacitance of capacitor array 100 connected between node 271 and inverting input lead 70 of operational amplifier 18 and the capacitance of capacitor 19. Similarly, the gain $G_2$ of gain stage 120 is equal to the negative of the ratio of the capacitance of capacitor array 101 connected between node 371 and the inverting input lead 270 of operational amplifier 29 and the capacitance of capacitor 30.

At time $T_4$ switches 20, 22, 31 and 33 open, and switches 21 and 32 close, thus taking gain stages 110 and 120 out of the initialization mode. Switches 34 and 37 close, thus connecting capacitor 36 between output node 170 of gain stage 120 and the output node 190 of buffer amplifier 46a. Switch 24 opens and switch 23 closes, thus charging capacitor 36 to $V'_{out}=(G_2 V_{off1}+V_{off2})-(V_{off3})$. Switch 13 opens and dummy switch 57 closes, thus causing the offset voltage $V_{off1}$ of gain stage 110 to include a component due to the switching action of switches 13 and 57. Switches 12, 13 and 57 are closely matched, thus the offset voltage due to the operation of switches 13 and 57 will be substantially equal to the offset voltage due to the operation of switches 12 and 13. The use of dummy switch 57 allows the offset voltage caused by the operation of switches 12 and 13 (during sampling of the input voltage) to be balanced by the offset voltage caused by the operation of switches 13 and 57 during time $T_4$ (during sampling of the offset voltage), thereby providing a highly accurate output voltage $V_{out}$. The use of dummy switch 57 compensates for the effects of transient signals due to switch operation. This is particularly important at high operating speeds.

At time $T_5$, switches 34 and 37 open, and switches 35 and 106 close, thus connecting capacitor 36 between ground and the inverting input lead of operational amplifier 38. At all times (other than during transient periods when the charge on capacitor 39 is changing) the voltage on the inverting input lead of operational amplifier 38 is equal to $V_{off3}$ because the non-inverting input lead of operational amplifier is connected to ground. The closing of switches 35 and 106 and opening of switches 34 and 37 superimposes the voltage (0-$V_{off3}$) onto the voltage already across capacitor 36 of $(G_2V_{off1}+V_{off2})-(V_{off3})$, thus integrating $(0-V_{off3})-(G_2V_{off1}+V_{off2}-V_{off3})=-(G_2V_{off1}+V_{off2})$ on integration capacitor 39 of integrator stage 130.

At time $T_6$, switches 34 and 106 open and switches 35 and 37 close, thus connecting capacitor 36 between ground and node 190. This charges capacitor 36 to (0-$V_{off3}$). Switch 23 opens, thus disconnecting output node 191 of gain stage 110 from node 371 of gain stage 120. Switches 12 and 57 open and switch 13 closes, thus removing the input voltage $V_{in}$ from node 271, and discharging (initializing) capacitor array 100. Switch 24 closes, thus discharging capacitor array 101. Switches 20, 22, 31 and 33 close and switches 21 and 32 open, thus initializing gain stages 110 and 120.

At time $T_7$, switches 35 and 37 open and switches 34 and 106 close, thus connecting capacitor 36 between node 170 and the inverting input lead of operational amplifier 38. Switch 13 opens and switch 12 closes, thus applying the input voltage $V_{in}$ to input node 271 of gain stage 110. This provides $G_1G_2V_{in}+G_2V_{off1}+V_{off2}$ on node 170, thus charging capacitor 36 to $G_1G_2V_{in}+G_2V_{off1}+V_{off2}-V_{off3}$. Switches 20, 22, 31 and 33 open, and switches 21 and 32 close, thus taking gain stages 110 and 120 out of the initialization mode. Switch 23 closes and switch 24 opens, thus connecting output node 191 of gain stage 110 to input node 371 of gain stage 120. This integrates $(G_1G_2V_{in}+G_2V_{off1}+V_{off2}-V_{off3})-(0-V_{off3})=(G_1G_2V_{in})+G_2V_{off1}+V_{off2}$ on integration capacitor 39. The total integrated voltage on capacitor 39 from steps $T_5$ and $T_7$ is equal to $[-(G_2V_{off1}+V_{off2})+(G_1G_2V_{in}+G_2V_{off1}+V_{off2})]=G_1G_2V_{in}$.

Steps $T_3$ through $T_7$ are now repeated in sequence, thus integrating the sampled input voltage $V_{in}(N)$. Thus, at times $T_5$, $-(G_2V_{off1}+V_{off2})$ is integrated on capacitor 39. At times $T_7$, $(G_1G_2V_{in}(N)+G_2V_{off1}+V_{off2})$ is integrated on integration capacitor 39 of integrator stage 130.

After N such cycles, the output voltage is equal to $$V_{out}(N) = \sum_{k=1}^{N} -(G_2V_{off1}+V_{off2})+(G_1G_2V_{in}(N)+G_2V_{off1}+V_{off2}),$$

or $$V_{out}(N) = \sum_{k=1}^{N} G_1(K)G_2(K)V_{in}(K)$$

where
$V_{out}(N)$ = the output voltage on terminal 47 after N complete integration cycles;
$V_{off1}$ = the offset voltage of sample and hold circuit 110;
$V_{off2}$ = the offset voltage of sample and hold circuit 120;
$G_1(K)$ = the closed loop gain of operational amplifier 110 during the Kth integration cycle;
$G_2(K)$ = the closed loop gain of operational amplifier 120 during the Kth integration cycle; and
$V_{in}(K)$ = the input voltage on terminal 11 during the Kth integration cycle.

Steps $T_3-T_7$ are repeated for each sample of input voltage $V_{in}$, thus providing an integrated output voltage $V_{out}$ which is free from the effects of the inherent offset voltages of operational amplifier 18, 29, and 38. Of importance, the gain $G_1$ of gain stage 110 and the gain $G_2$ of gain stage 120 may be selected prior to the receipt of each input voltage sample. In this manner, the gain factor of each input voltage sample may be selected independently from the gain factor used in conjunction with other input voltage samples. When it is desired to initialize the integrator stage 130, the steps are repeated beginning with step $T_0$.

Thus, utilizing this invention a switched capacitor gain stage utilizing a capacitor array may be programmed to one of a plurality of desired gains. Furthermore, the effects of the inherent offset voltages of the operational amplifiers used in the circuit are eliminated.

TABLE I

| Time | Events | | Comments |
|---|---|---|---|
| $T_0$ | Switches open: | 41, 34, 35, 37, 106 | Initialize integrator stage 130 |
| | Switches close: | 40, 42, 44 | |
| $T_1$ | Switches open: | 12, 23, 21, 32, 57 | Initialize gain stages 110, 120 and capacitor arrays 100, 101 |
| | Switches close: | 13, 24, 20, 31, 22, 33 | |
| $T_2$ | Switches open: | 40, 42, 44 | $V_{off3}$ available on node 190. Integration stage 130 in integration mode |
| | Switches close: | 41 | |
| $T_3$ | Switches within capacitor arrays 100 and 101 operate | | Select gain factors $G_1$ and $G_2$ via capacitor arrays 100 and 101 |
| $T_4$ | Switches open: | 24, 20, 31, 13, 22, 33 | Store $G_2V_{off1}+V_{off2}-V_{off3}$ on capacitor 36 |
| | Switches close: | 23, 34, 37, 21, 32, 57 | |
| $T_5$ | Switches open: | 34, 37 | Store (0 − $V_{off3}$) on capacitor 36, thereby integrating −($G_2V_{off1}+V_{off2}$) on capacitor 39 |
| | Switches close: | 35, 106 | |
| $T_6$ | Switches open: | 34, 106, 23, 57, 12, 21, 32 | Store (0 − $V_{off3}$) on capacitor 36. Initialize gain stages 110, 120 and capacitor arrays 110, 101 |
| | Switches close: | 35, 37, 13, 22, 33, 31, 20, 24 | |

TABLE I-continued

| Time | Events | | Comments |
|---|---|---|---|
| $T_7$ | Switches open: | 13, 35, 37, 22, 33, 20. 31, 24 | Store $(G_1G_2V_{in} + G_2V_{off1} + V_{off2}) - V_{off3}$ on capacitor 36, thereby integrating $G_1G_2V_{in} + G_2V_{off1} + V_{off2}$ on capacitor 39. Total charge stored on capacitor 39 from steps $T_5$ and $T_7$ is equal to $G_1G_2V_{in}$ |
| | Switches close: | 12, 34, 106, 21, 32, 23 | |
| | Repeat steps $T_3$–$T_7$ until integrator stage is to be reinitialized. For reinitialization of integrator stage, begin at step $T_0$. | | |

We claim:

1. An electronic gain-integrator stage having an input terminal for receiving an input signal and having an output terminal, comprising:

M operational amplifier gain stages connected in series where M is a selected integer varying from 1 to K, where K is the maximum number of gain stages, said M operational amplifier gain stages each having a programmable gain and an inherent offset voltage and said Mth gain stage having an output lead which provides an output signal which includes an error component which is a function of said offset voltages of said M operational amplifier gain stages;

an operational amplifier integrator stage connected to said gain stages, having an inherent offset voltage, and including means for integrating during the first half of a selected cycle the negative of said error component, which is produced in response to the initialization of said M gain stages, and integrating during the second half of said selected cycle both the positive of said error component, which is produced in response to said input signal, and the positive of said input signal multiplied by each of said programmable gains of each of said M gain stages;

wherein the negative of said error component is integrated once for each integration of the input signal, whereby the effects of said offset voltages of each of said M gain stages are eliminated.

2. The structure as in claim 1 wherein each said operational amplifier gain stage comprises:

an operational amplifier having an inverting input lead, a noninverting input lead connected to a reference voltage, and an output lead;

feedback means containing a passive element connected between said inverting input lead and said output lead of said operational amplifier;

an array of N passive components connected between said inverting input lead and an input terminal, where N is a selected integer varying from 1 to J, where J is the maximum number of passive components; and a plurality of switch means for selectively connecting between said inverting input lead of said operational amplifier and said input terminal desired ones of said N passive elements of said array;

whereby said programmable gain of said operational amplifier gain stage is determined by the value of said selected ones of said N components of said array.

3. Structure as in claim 2 wherein said array of N passive components comprises N capacitors and said feedback means comprises a capacitor.

4. Structure as in claim 3 wherein said capacitors of said array are binary weighted, wherein the capacitance value of each capacitor is equal to $2^{L-1}C$, where L is a first integer ranging from 1 to N, and N is a second integer equal to the number of passive elements in the array.

5. Structure as in claim 2 wherein said programmable gain of each of said operational amplifier gain stage is selected once for each integration of the input signal.

6. The structure as in claim 1 wherein said means for integrating further comprises means for applying to said operational amplifier integrator stage a voltage equal to the voltage to be integrated minus said inherent offset voltage of said operational amplifier integrator stage, such that said operational amplifier integrator stage integrates said voltage to be integrated and produces an output signal free from the effects of said inherent offset voltage of said operational amplifier integrator stage.

7. The structure as in claim 6 wherein said operational amplifier integrator stage comprises:

an operational amplifier having an inverting input lead serving as the input lead of said operational amplifier integrator stage, a noninverting input lead connected to a reference voltage, and an output lead;

a first buffer amplifier having an input lead connected to said output lead of said operational amplifier of said operational amplifier integrator stage and having an output lead serving as said output terminal of said electronic gain-integrator stage; and an integrator capacitor having a first plate connected to said inverting input lead of said operational amplifier of said operational amplifier integrator stage and having a second plate for connection to said output lead of said first buffer amplifier.

8. The structure as in claim 7 wherein said means for applying includes a means for producing a voltage equal to said offset voltage of said operational amplifier integrator stage, said means for producing comprising:

a second buffer amplifier having an input lead and an output lead;

a storage capacitor having a first plate connected to a reference voltage and a second plate connected to said input lead of said second buffer amplifier;

means for connecting said inverting input lead of said operational amplifier of said operational amplifier integrator stage to said output lead of said first buffer amplifier, thereby placing said operational amplifier integrator stage in the unity gain mode, thereby generating on said output lead of said operational amplifier of said operational amplifier integrator stage said offset voltage of said operational amplifier integrator stage; and switch means for connecting said second plate of said storage capacitor to said output lead of said operational amplifier of said operational amplifier integrator stage when said integrator stage is in the unity gain mode, and for producing on said output lead of said second buffer amplifier a voltage equal to said offset voltage of said operational amplifier integrator stage when said operational amplifier integrator stage is not in the unity gain mode.

9. The structure as in claim 8 wherein said means for applying further comprises:

an input capacitor having a first and a second plate;

a first switch means connected between said output lead of said Mth operational amplifier gain stage and said first plate of said input capacitor;

a second switch means connected between said first plate of said input capacitor and a reference voltage;

a third switch means connected between said second plate of said input capacitor and said output lead of said second buffer amplifier; and a fourth switch means connected between said second plate of said input capacitor and said input lead of said operational amplifier integrator stage;

means for operating said first, second, third, and fourth switch means wherein:

during a first period said first and said third switch means are closed and said second and said fourth switch means are open, thereby storing on said input capacitor a voltage equal to said error component, which is produced in response to said initialization of said M gain stages, minus said offset voltage of said operational amplifier integrator stage;

during a second period said first and said third switch means are open and said second and said fourth switch means are closed, thereby storing on said input capacitor a voltage equal to the negative of said offset voltage of said operational amplifier integrator stage, said first and second period occuring during said first half of said selected cycle such that the negative of said error component, which is produced in response to the initialization of said M gain stages, is integrated on said integrator capacitor and that the effects of said offset voltage of said operational amplifier integrator stage are eliminated;

during a third period said first and fourth switch means are open and said second and third switch means are closed, thereby storing on said input capacitor a voltage equal to the negative of said offset voltage of said operational amplifier integrator stage; and during a fourth period said second and third switch means are open and said first and fourth switch means are closed, thereby storing on said input capcitor a voltage equal to the positive of said error component, which is produced in response to said input signals, plus the positive of said input signal multiplied by each of said programmable gains of each of said M gain stages, minus said offset voltage of said operational amplifier integrator stage, and said third and fourth period occuring during said second half of said selected cycle such that the positive of said error component, which is produced in response to said input signal, and the positive of said input signal multiplied by each of said programmable gains of each of said M gain stages is integrated on said integrator capacitor and that the effects of said offset voltage of said operational amplifier integrator stage are eliminated.

10. The method of eliminating the effects of the offset voltages of a gain-integrator stage which includes an operational amplifier integrator stage and a plurality of operational amplifier gain stages, where M is a selected positive integer, which comprises the steps of:

initializing said operational amplifier integrator stage, thereby producing an inherent offset voltage;

initializing said M operational amplifier gain stages, thereby producing a first output signal, which is a function of the inherent offset voltages of each operational amplifier gain stage;

storing said first output signal minus said offset voltage of said operational amplifier integrator stage on an input capacitor;

storing the negative of said offset voltage of said operational amplifier integrator stage on said input capacitor, thereby integrating the negative of said first output signal of said operational amplifier gain stages and eliminating the effects of said offset voltage of said operational amplifier integrator stage;

storing said offset voltage of said operational amplifier integrator stage on said input capacitor;

applying an input signal to said operational amplifier gain stages, thereby producing a second output signal which is a function of said offset voltages of said operational amplifier gain stages, of said input signal, and the gain of each said operational amplifier gain stage; and storing on said input capacitor of said second output signal minus said offset voltage of said operational amplifier integrator stage, thereby integrating said second output signal on said integrating capacitor and eliminating the effects of said offset voltage of said operational amplifier integrator stage, thereby eliminating the effects of said offset voltage of operational amplifier gain stages.

* * * * *